(12) United States Patent
Chae et al.

(10) Patent No.: US 6,372,626 B1
(45) Date of Patent: Apr. 16, 2002

(54) METHOD OF REDUCING STEP HEIGHTS IN INTEGRATED CIRCUITS BY USING DUMMY CONDUCTIVE LINES, AND INTEGRATED CIRCUITS FABRICATED THEREBY

(75) Inventors: Bong-seok Chae; Kye-hyun Kyung, both of Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/361,919

(22) Filed: Jul. 27, 1999

(30) Foreign Application Priority Data

Aug. 26, 1998 (KR) ............................. 98-34679

(51) Int. Cl.$^7$ ............... H01L 21/4763; H01L 21/44; H01L 21/311; H01L 21/31
(52) U.S. Cl. ............... 438/618; 438/666; 438/669; 438/697; 438/758; 438/926
(58) Field of Search ............... 438/631, 618, 438/666, 633, 697, 669, 926, 758

(56) References Cited

U.S. PATENT DOCUMENTS 5,281,555 A * 1/1994 Cho ..................... 437/195
5,534,728 A   7/1996 Kim et al. ............. 257/692

FOREIGN PATENT DOCUMENTS

JP           63104451          5/1988

* cited by examiner

*Primary Examiner*—Olik Chaudhuri
*Assistant Examiner*—Shrinivas H. Rao
(74) *Attorney, Agent, or Firm*—Myers Bigel Sibley & Sajovec

(57) ABSTRACT

A step height between first and second elevated conductive lines that are laterally spaced apart on an integrated circuit substrate may be reduced by forming a dummy conductive line beneath the second conductive line, to further elevate the second conductive line on the integrated circuit substrate. Depth-of-focus may thereby be improved so that reliability of the conductive lines may also be improved. The second conductive line and the dummy conductive line vertically overlap by an amount that is less than one half the width of the second conductive line. Thus, the capacitance between the second conductive line and the dummy conductive line may be reduced. Undue delay therefore need not be created by introduction of the dummy conductive line.

6 Claims, 3 Drawing Sheets

METHOD OF REDUCING STEP HEIGHTS IN INTEGRATED CIRCUITS BY USING DUMMY CONDUCTIVE LINES, AND INTEGRATED CIRCUITS FABRICATED THEREBY

FIELD OF THE INVENTION

This invention relates to integrated circuit devices and fabrication methods therefor, and more particularly to integrated circuits including conductive lines thereon and fabrication methods therefor.

BACKGROUND OF THE INVENTION

Integrated circuits are widely used in consumer and commercial applications. As is well known to those having skill in the art, integrated circuits generally include a large number of active devices in an integrated circuit substrate, and one or more layers of conductive lines, also referred to as wiring layers, on the integrated circuit substrate, to form interconnections for the active devices in the substrate.

As the integration density of integrated circuits continues to increase, it may become increasingly difficult to form high density conductive lines on integrated circuit substrates. More specifically, as the integration density of integrated circuit devices continues to increase, one or more steps may be created on the integrated circuit substrate due to varying topography thereof. Due to these steps, it may become increasingly difficult to perform a high density photolithographic process to define conductive lines, because the depth-of-focus margin may increase.

The depth-of-focus problem is illustrated in FIG. 1, which is a cross-sectional view of an integrated circuit. In FIG. 1, at least one layer 131 is formed on an integrated circuit substrate 141, such as a silicon semiconductor substrate. The layer 131 has a step of height h. A conductive layer is blanket formed on the layer 131. A photoresist 111 is formed on the conductive layer, to thereby pattern first and second conductive lines 121 and 122, and a conductive connector line 123 therebetween.

Unfortunately, however, the first conductive line 121 is elevated on the integrated circuit substrate relative to the second conductive line 122, due to the nonuniform topography of the underlying layer 131. Since the conductive layer that comprises conductive lines 121, 122 and 123 has a step, it may be difficult to obtain proper depth-of-focus for patterning the conductive layer using the photoresist layer 111. It therefore may be difficult to perform accurate patterning. Accordingly, one or more of the conductive lines 121, 122 and 123 may break. As the thickness and/or width of the conductive lines 121, 122 and 123 continues to decrease, and the step height h of the insulating layer 131 continues to increase, reliability and/or other problems caused by the increased depth-of-focus margin may be exacerbated.

SUMMARY OF THE INVENTION

It is therefore an object of the present invention to provide improved methods of forming conductive lines on integrated circuit substrates, and integrated circuits so formed.

It is another object of the present invention to provide methods that can reduce step heights between first and second conductive lines that are laterally spaced apart on an integrated circuit substrate, and integrated circuits so formed.

These and other objects can be provided according to the present invention, by methods of reducing a step height between first and second conductive lines that are laterally spaced apart on an integrated circuit substrate, wherein the first conductive line is elevated on the integrated circuit substrate relative to the second conductive line, to create a step. According to the invention, a dummy conductive line is formed beneath the second conductive line, to further elevate the second conductive line on the integrated circuit substrate, and thereby reduce the step height between the first and second conductive lines. The second conductive line and the dummy conductive line vertically overlap by an amount that is less than one half the width of the second conductive line. Depth-of-focus thereby may be improved, so that reliability of the conductive lines also may be improved. Moreover, the capacitance between the second conductive line and the dummy conductive line may be reduced. It will be understood that as used herein, "vertically" indicates a direction that is generally orthogonal to the laterally extending faces of the integrated circuit substrate, and does not indicate an absolute orientation.

More particularly, according to the present invention, a dummy conductive line is formed on an integrated circuit substrate. First and second conductive lines are then formed on the integrated circuit substrate, such that the second conductive line vertically overlaps the dummy conductive line by an amount that is less than one half the width of the second conductive line, to thereby reduce a step height between the first and second conductive lines compared to absence of the dummy conductive line while allowing reduced capacitance between the second conductive line and the dummy conductive line. The first and second conductive lines preferably are formed by forming a conductive layer on the integrated circuit substrate including on the dummy conductive line, and patterning the conductive layer to define the first and second conductive lines, such that the second conductive line vertically overlaps the dummy conductive line by an amount that is less than one half the width of the second conductive line. An insulating layer may be formed on the dummy conductive line prior to forming the first and second conductive lines.

The dummy conductive line and the first and second conductive lines may comprise metal, polysilicon and/or other known conductors. The dummy conductive line may be connected to a power supply voltage, a ground voltage, a signal voltage, or may remain floating. However, the dummy conductive line is formed beneath the second conductive line, so as to reduce the step height between the first and second conductive lines while allowing reduced capacitance, rather than to perform a signal carrying function in the integrated circuit.

Integrated circuits according to the present invention comprise an integrated circuit substrate, a dummy conductive line on the integrated circuit substrate and first and second conductive lines on the integrated circuit substrate, such that the second conductive line vertically overlaps the dummy conductive line by an amount that is less than one half the width of the second conductive line, to thereby reduce a step height between the first and second conductive lines compared to absence of the dummy conductive line. Accordingly, the step height may be reduced, to thereby allow improved depth of focus, and thereby allow improved reliability of integrated circuit devices to be obtained. Moreover, capacitance between the second conductive line and the dummy conductive line may be reduced.

DETAILED DESCRIPTION OF PREFERRED EMBODIMENTS

Figure 1:
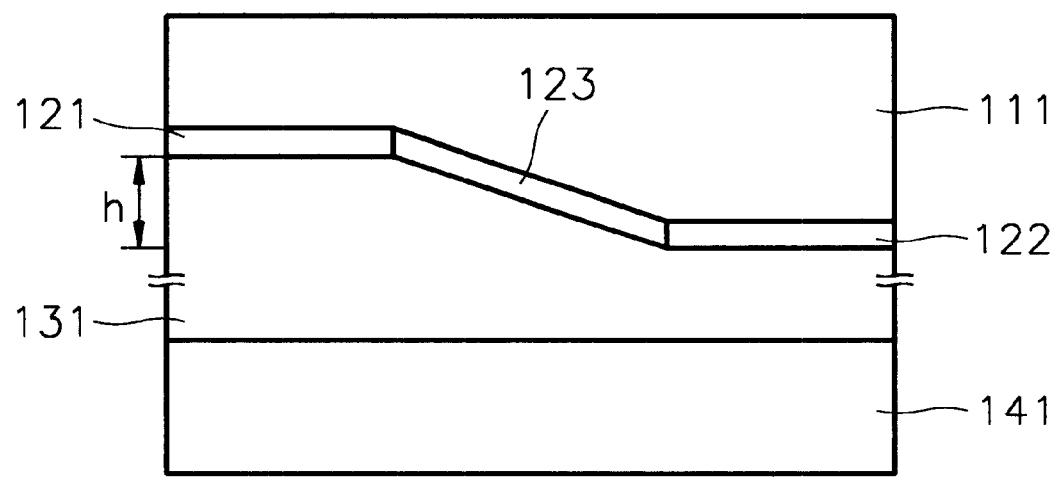
FIG. 1 is a cross-sectional view of a conventional integrate circuit including a step thereon.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

Figure 2:
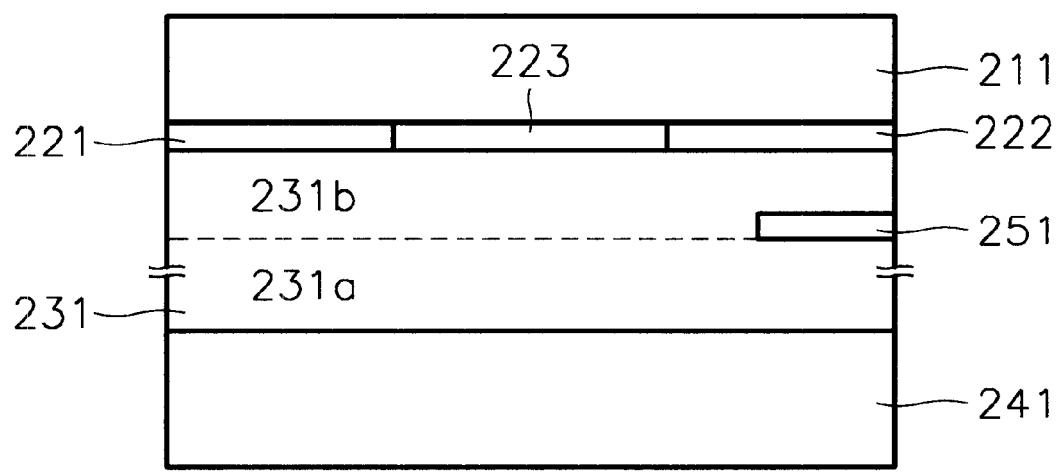
FIG. 2 is a cross-sectional view of integrated circuits according to the present invention, including a dummy conductive line that can reduce step height.

Referring now to FIG. 2, a cross-sectional view of integrated circuit substrates according to the present invention now will be described. As shown in FIG. 2, an integrated circuit substrate 241, such as a silicon semiconductor substrate, includes at least one layer 231 thereon. A dummy conductive line 251 is included within the layer 231. Comparing FIG. 1 to FIG. 2, the presence of the dummy conductive line 251 in the layer 231 can reduce the step height in the layer 231.

It will be understood by those having skill in the art that the layer 231 may be formed by forming a first sublayer 231a, forming the dummy conductive line 251 on the first sublayer 231a, and then forming a second sublayer 231b on the first sublayer 231a including on the dummy conductive line 251. The dummy conductive line 251 may comprise metal, polysilicon and/or other conventional conductors. The layer 231 and sublayers 231a and 231b may comprise insulating and/or conductive layers.

Continuing with the description of FIG. 2, a conductive layer is then formed on the layer 231, including on the dummy conductive line. A photoresist layer 211 is then formed using conventional techniques. The photoresist layer is used to pattern a first conductive line 221 and a second conductive line 222 with a third conductive line 223 therebetween. As shown in FIG. 2, the step height has been reduced and preferably eliminated, so that the first conductive line 221, the second conductive line 222 and the third conductive line 223 may be formed at the same elevation.

Thus, the depth-of-focus margin can decrease, and step coverage problems may be reduced. Accordingly, high density patterning can be performed which can result in reduced breakage of the conductive lines.

As also shown in FIG. 2, the second conductive line 222 and the dummy conductive line 251 vertically overlap by an amount that is less than one half the width of the second conductive line. The capacitance between the second conductive line 222 and the dummy conductive line 251 thereby may be reduced while the step height and the depth-of-focus margin also may be reduced.

The dummy conductive line 251 may be left floating, may be connected to a power supply voltage or to ground. Additionally, the dummy conductive line 251 may be used as a power line or a signal line for the internal circuits of the integrated circuit.

Figure 3:
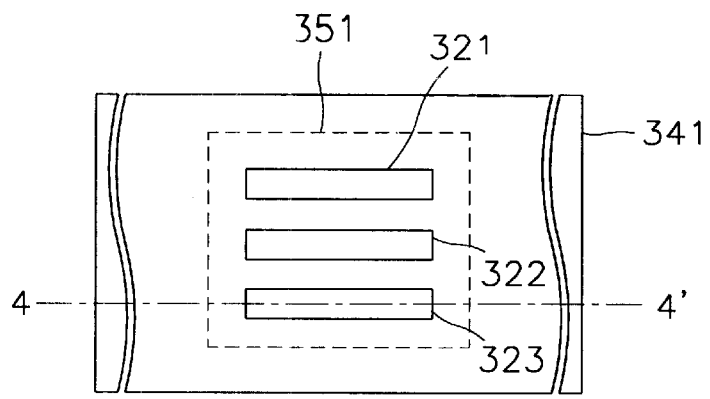
FIG. 3 is a plan view of an integrated circuit including a dummy conductive line.

Referring now to FIG. 3, an integrated circuit memory device includes an integrated circuit substrate 341, a dummy conductive line 351 and a plurality of conductive lines 321, 322 and 323. The plurality of conductive lines 321, 322 and 323 overlap with the dummy conductive line 351. The dummy conductive line 351 elevates the conductive lines 321, 322 and 323 relative to other conductive lines on the integrated circuit substrate, to thereby reduce the step height between the conductive lines 321, 322.and 323 and other conductive lines on the integrated circuit substrate. The depth-of-focus margins thereby can be reduced. Unfortunately, large capacitance between the dummy conductive line 351 and-the conductive lines 321, 322 and 323 may be present.

Figure 4:
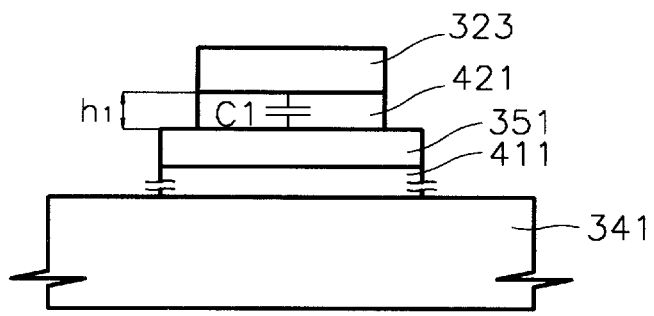
FIG. 4 is a cross-sectional view along the line 4–4' of FIG. 3.

FIG. 4 is a cross-sectional view along the line 4–4' of FIG. 3. As shown in FIG. 4, a first layer 411 is formed on the integrated circuit substrate 341 and the dummy conductive line 351 is formed on the first layer 411. A second layer 421 and a conductive line 323 are formed on the dummy conductive line 351. As shown in FIG. 4, a large parasitic capacitance C1 may be created between the dummy conductive line 351 and the conductive line 323. This large parasitic capacitance may delay signals that pass through the conductive line 323. The dummy conductive line 351 may be electrically floating. Alternatively, the dummy conductive line 351 may be electrically connected to the integrated circuit substrate 341, to a power supply voltage or to a ground voltage. The conductive lines may comprise aluminum, copper, combinations thereof, other metals and/or conductive polysilicon. The first and second layers 411 and 421 may comprise insulating and/or conductive layers.

Figure 5:
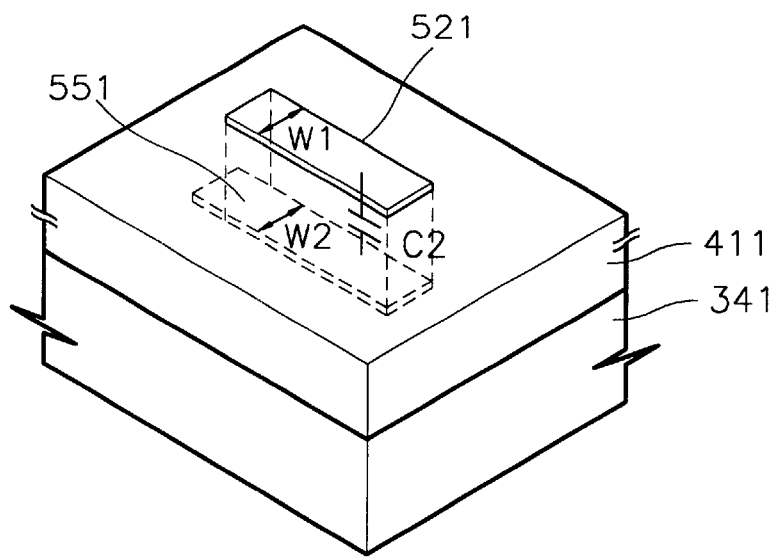
FIG. 5 is a perspective view of an integrated circuit including a dummy conductive line.

FIG. 5 illustrates another embodiment of integrated circuits, wherein reduced overlap between dummy conductive lines and other conductive lines may be provided, while still allowing reduced step height to be obtained. As shown in FIG. 5, a dummy conductive line 551 has width W2, and a first conductive line 521 has width W1. The width W2 of the dummy conductive line 551 preferably is the same as the width W1 of the first conductive line 521. However, the dummy conductive line 551 preferably is longer than or equal to that of the conductive line 521. Thus, the dummy conductive line 551 may be congruent to the first conductive line 521. In FIG. 5, the dummy conductive line may comprise polysilicon and/or metal, and the first conductive line 521 may be a signal line that transmits a signal. Parasitic capacitance C2 is generated between the dummy conductive line 551 and the first conductive line 521 of FIG. 5.

Figure 6:
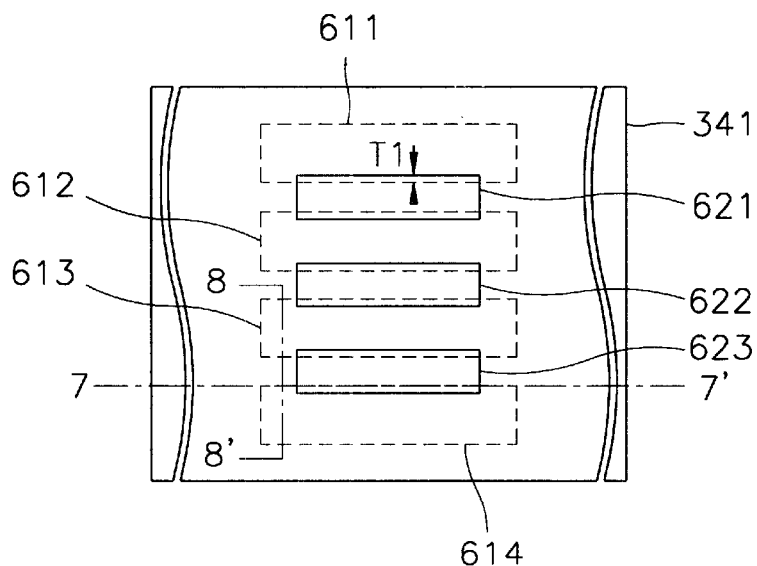
FIG. 6 is a plan view of an integrated circuit according to an embodiment of the present invention.

FIG. 6 is a plan view of an embodiment of the present invention. As shown in FIG. 6, a plurality of dummy conductive lines 611, 612, 613 and 614 are provided on an integrated circuit substrate 341. A plurality of conductive lines 621, 622 and 623 are provided that vertically overlap with the dummy conductive lines 611, 612, 613 and 614. More specifically, the conductive lines 621, 622 and 623 are located between the dummy conductive lines 611, 612, 613 and 614, while partially vertically overlapping at a width T1. Preferably, the vertically overlapping width between the dummy conductive lines and the conductive lines is no greater than half the width of the conductive lines 621, 622 and 623. A preferred vertical overlapping width may range between about 0.1 μm and about 0.3 μm.

Figure 7:
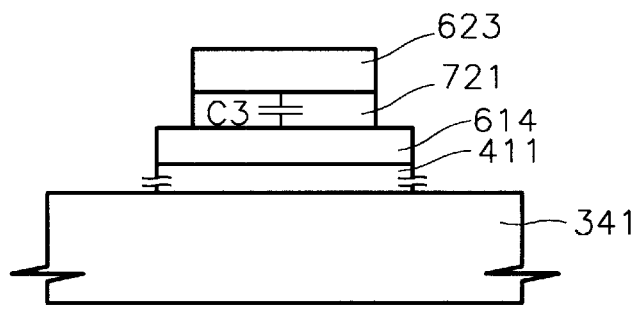
FIG. 7 is a cross-sectional view along the line 7–7' of FIG. 6.

FIG. 7 is a cross-sectional view taken along the line 7–7' of FIG. 6. As shown in FIG. 7, a first layer 411 is formed on the integrated circuit substrate 341 and the dummy conductive line 614 is formed on the first layer 411. A second layer 721 and the conductive line 623 are formed on the dummy metal line 614. The dummy metal line 614 may be electrically floating or may be connected as was described above. Parasitic capacitance C3 shown in FIG. 7, may be generated between each dummy conductive line 611–614 and each conductive line 621–623. The parasitic capacitance C3 may be reduced relative to the parasitic capacitance C2 of FIG. 5 or C1 of FIG. 4.

Figure 8:
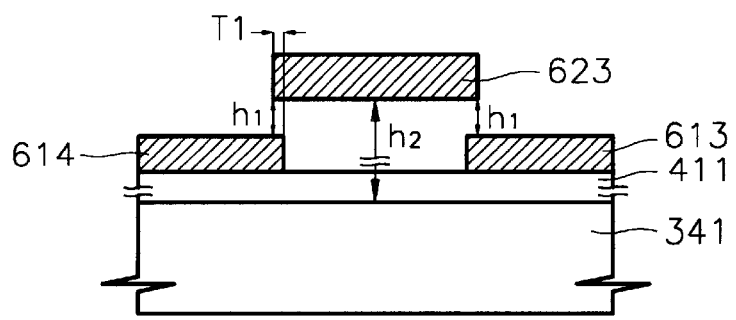
FIG. 8 is a cross-sectional view along, the line 8–8' of FIG. 6.

FIG. 8 is a cross-sectional view taken along the line 8–8' of FIG. 6. As shown in FIG. 8, reduced capacitance may be obtained relative to FIG. 4 because capacitance is inversely proportional to height. Thus, the capacitance C3 between the conductive line 623 and the dummy lines 613 and 614 of FIG. 8 is inversely proportional to h2 and h1, whereas the capacitance C1 between the conductive line 323 and the dummy line 351 of FIG. 4 is proportional to h1 only. Accordingly, capacitance may be reduced.

The parasitic capacitance C3 of an integrated circuit device of FIGS. 6, 7 and 8 were simulated relative to the parasitic capacitance C1 of an integrated circuit device of FIG. 4. The results of the simulation are shown in Table 1:

TABLE 1

| Width of each conductive metal line shown in FIGS. 6, 7 and 8 (μm) | Decreased percentage (X) of parasitic capacitance C3 relative to C1 |
|---|---|
| 1 | 27 |
| 2 | 29 |
| 3 | 33 |
| 4 | 38 |

In Table 1, the decreased percentage (X) of the parasitic capacitance C3 with respect to the parasitic capacitance C1 of FIG. 4 was calculated by the following Equation (1):

$$X = \frac{C1 - C3}{C1} \times 100 \quad (1)$$

As can be seen from Table 1, the parasitic capacitance C3 of an integrated circuit having the structure of FIG. 7 may be reduced compared with the parasitic capacitance C1 of FIG. 4.

Accordingly, by providing a dummy conductive line beneath at least one conductive line on an integrated circuit substrate, the depth-of-focus margin may be reduced and step height may be reduced, so that breaking or cracking of conductive lines can be reduced and preferably prevented. Moreover, low values of parasitic capacitance may be provided so that undue delay need not be created.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method of reducing a step height between first and second conductive lines that are laterally spaced apart on an integrated circuit substrate, but that do not overlap on the integrated circuit substrate, the first conductive line being elevated on the integrated circuit substrate relative to the second conductive line to create the step height, the step height reducing method comprising the step of:

forming a dummy conductive line beneath the second conductive line and vertically overlapping with the second conductive line by an amount that is greater than zero but less than one half the width of the second conductive line to further elevate the second conductive line on the integrated circuit substrate and thereby reduce the step height between the first and second conductive lines, wherein the second conductive line and the dummy conductive line vertically overlap by an amount that is greater than zero but less than one half the width of the second conductive line.

2. A method according to claim 1 wherein the forming step is followed by the steps of:

forming a conductive layer on the integrated circuit substrate including on the dummy conductive line; and patterning the conductive layer to define the first and second conductive lines such that the second conductive line and the dummy conductive line vertically overlap by an amount that is greater than zero but less than one half the width of the second conductive line.

3. A method according to claim 2 wherein the following step is performed between the steps of forming dummy conductive line and forming a conductive layer:

forming an insulating layer on the dummy conductive line.

4. A method of forming first and second conductive lines that are laterally spaced apart on an integrated circuit substrate, but that do not overlap on the integrated circuit substrate, the method comprising the steps of:

forming a dummy conductive line on the integrated circuit substrate; and forming first and second conductive lines on the integrated circuit substrate such that the second conductive line vertically overlaps the dummy conductive line by an amount that is greater than zero but less than one half the width of the second conductive line, to thereby reduce a step height between the first and second conductive lines compared to absence of the dummy conductive line.

5. A method according to claim 4 wherein the step of forming first and second conductive lines comprises the steps of:

forming a conductive layer on the integrated circuit substrate including on the dummy conductive line; and patterning the conductive layer to define the first and second conductive lines such that the second conductive line vertically overlaps the dummy conductive line by an amount that is greater than zero but less than one half the width of the second conductive line.

6. A method according to claim 4 wherein the following step is performed between the steps of forming a dummy conductive line and forming first and second conductive lines:

forming an insulating layer on the dummy conductive line.

* * * * *